(12) United States Patent
Yamaguchi et al.

(10) Patent No.: US 6,919,667 B2
(45) Date of Patent: Jul. 19, 2005

(54) PIEZOELECTRIC/ELECTROSTRICTIVE FILM DEVICE

(75) Inventors: Hirofumi Yamaguchi, Komaki (JP); Toshikatsu Kashiwaya, Inazawa (JP); Kazuhiro Yamamoto, Nagoya (JP); Masao Takahashi, Ama-gun (JP)

(73) Assignee: NGK Insulators, Ltd., Nagoya (JP)

( * ) Notice: Subject to any disclaimer, the term of this patent is extended or adjusted under 35 U.S.C. 154(b) by 93 days.

(21) Appl. No.: 10/241,681

(22) Filed: Sep. 11, 2002

(65) Prior Publication Data

US 2003/0048046 A1 Mar. 13, 2003

(30) Foreign Application Priority Data

Sep. 13, 2001 (JP) ........................................ 2001-277871

(51) Int. Cl.[7] .............................................. H01L 41/08
(52) U.S. Cl. ..................... 310/324; 310/328; 310/330; 310/358
(58) Field of Search ................................ 310/358, 359, 310/328

(56) References Cited

U.S. PATENT DOCUMENTS

| | | | | |
|---|---|---|---|---|
| 5,512,793 A | * | 4/1996 | Takeuchi et al. | ............ 310/328 |
| 5,788,876 A | * | 8/1998 | Chen | ................... 252/62.9 PZ |
| 6,207,069 B1 | * | 3/2001 | Furukawa et al. | .... 252/62.9 PZ |
| 6,241,908 B1 | * | 6/2001 | Hirose et al. | .......... 252/62.9 R |
| 6,329,656 B1 | * | 12/2001 | Whatmore | ............... 250/338.2 |
| 6,482,259 B1 | * | 11/2002 | Lee et al. | ...................... 117/3 |

OTHER PUBLICATIONS

Anzai, K., "Preparation of Electronic Materials by Electrophoretic Deposition", Denki Kagaku 53, No. 1 (1985), pp. 63–68 (w/English Translation).
Goto, A.; Hamagami, J.; Umegaki, T.; and Yamashita, K., "$PbZrO_3/PbTiO_3$ Composite Ceramics Fabricated by Electrophoretic Deposition," Proceedings of First Symposium on Higher–Order Ceramic Formation Method Based on Electrophoresis 1998, pp. 5–6 (w/Englsih Translation).
Yamashita, K., "Hybridization of Ceramics by Electrophoretic Deposition," Proceedings of First Symposium on Higher–Order Ceramic Formation Method Based on Electrophoresis 1998, pp. 23–24 (w/English Translation).
U.S. Appl. No. 10/241,414, filed Sep. 11, 2002, Yamaguchi et al.

* cited by examiner

Primary Examiner—Mark Budd
(74) Attorney, Agent, or Firm—Burr & Brown

(57) ABSTRACT

A piezoelectric/electrostrictive film device is provided, including a piezoelectric/electrostrictive layer and at least a pair of electrodes formed on the piezoelectric/electrostrictive layer. A perovskite piezoelectric/electrostrictive material of the piezoelectric/electrostrictive layer contains Pb, and the perovskite piezoelectric/electrostrictive material contains $MnO_2$ in an amount of 0.1 to 0.5% by weight. Specifically, the perovskite piezoelectric/electrostrictive material contains $Pb(Mg_{1/3}Nb_{2/3})O_3$—$PbZrO_3$—$PbTiO_3$ in which a part of Pb is substituted with Sr.

3 Claims, 11 Drawing Sheets

FIG. 8

| SAMPLE | COMPOSITION | | | CHANGE OF DISPLACEMENT AMOUNT | | | |
|---|---|---|---|---|---|---|---|
| | A/B | AMOUNT OF ADDITION OF MnO$_2$ (wt%) | AMOUNT OF SUB-STITUTION WITH Sr | INITIAL DISPLACE-MENT AMOUNT | AFTER 50 HOURS | AFTER 150 HOURS | AFTER 500 HOURS |
| COMPARATIVE EXAMPLE 1 | 1 | 0 | 0 | 100 | 53 (47.0) | 54 (46.0) | 50 (50.0) |
| COMPARATIVE EXAMPLE 2 | 1 | 0.05 | 0 | 103 | 82 (20.4) | 80 (22.3) | 77 (25.2) |
| EXAMPLE 1 | 1 | 0.1 | 0 | 117 | 110 (6.0) | 107 (8.5) | 105 (10.3) |
| EXAMPLE 2 | 1 | 0.2 | 0 | 125 | 117 (6.4) | 115 (8.0) | 113 (9.6) |
| EXAMPLE 3 | 1 | 0.3 | 0 | 127 | 118 (7.1) | 116 (8.7) | 112 (11.8) |
| EXAMPLE 4 | 1 | 0.4 | 0 | 131 | 120 (8.4) | 118 (9.9) | 113 (13.7) |
| EXAMPLE 5 | 1 | 0.5 | 0 | 131 | 119 (9.2) | 118 (9.9) | 113 (13.7) |
| COMPARATIVE EXAMPLE 3 | 1 | 1.0 | 0 | 105 | 83 (21.0) | 81 (22.9) | 75 (28.6) |
| COMPARATIVE EXAMPLE 4 | 1 | 0 | 10 | 102 | 57 (44.1) | 56 (45.1) | 52 (49.0) |
| COMPARATIVE EXAMPLE 5 | 1 | 0.05 | 10 | 105 | 88 (16.2) | 87 (17.1) | 79 (24.8) |
| EXAMPLE 6 | 1 | 0.1 | 10 | 125 | 121 (3.2) | 118 (5.6) | 115 (8.0) |
| EXAMPLE 7 | 1 | 0.2 | 10 | 132 | 127 (3.8) | 125 (5.3) | 125 (5.3) |
| EXAMPLE 8 | 1 | 0.3 | 10 | 139 | 130 (6.5) | 128 (7.9) | 126 (9.4) |
| EXAMPLE 9 | 1 | 0.4 | 10 | 144 | 135 (6.3) | 132 (8.3) | 130 (9.7) |
| EXAMPLE 10 | 1 | 0.5 | 10 | 143 | 133 (7.0) | 130 (9.1) | 129 (9.8) |
| COMPARATIVE EXAMPLE 6 | 1 | 1.0 | 10 | 107 | 85 (20.6) | 83 (22.4) | 77 (28.0) |
| EXAMPLE 11 | 1 | 0.2 | 2 | 130 | 123 (5.4) | 121 (6.9) | 119 (8.5) |
| EXAMPLE 12 | 1 | 0.2 | 5 | 131 | 124 (5.3) | 123 (6.1) | 121 (7.6) |
| EXAMPLE 13 | 1 | 0.2 | 15 | 132 | 120 (9.1) | 119 (9.8) | 118 (10.6) |
| COMPARATIVE EXAMPLE 7 | 1 | 0.2 | 20 | 133 | 98 (26.3) | 87 (34.6) | 80 (39.8) |
| EXAMPLE 14 | 0.94 | 0.2 | 10 | 141 | 135 (4.3) | 134 (5.0) | 133 (5.7) |
| EXAMPLE 15 | 0.96 | 0.2 | 10 | 143 | 140 (2.1) | 137 (4.2) | 136 (4.9) |
| EXAMPLE 16 | 0.98 | 0.2 | 10 | 140 | 135 (3.6) | 133 (5.0) | 133 (5.0) |
| EXAMPLE 17 | 1.02 | 0.2 | 10 | 138 | 134 (2.9) | 132 (4.3) | 131 (5.1) |
| EXAMPLE 18 | 1.04 | 0.2 | 10 | 137 | 133 (2.9) | 131 (4.4) | 130 (5.1) |
| EXAMPLE 19 | 1.06 | 0.2 | 10 | 139 | 133 (4.3) | 132 (5.0) | 132 (5.0) |
| EXAMPLE 20 | 0.96 | 0.2 | 0 | 141 | 135 (4.3) | 134 (5.0) | 133 (5.7) |
| EXAMPLE 21 | 1.02 | 0.2 | 0 | 135 | 127 (5.9) | 125 (7.1) | 124 (8.1) |

PIEZOELECTRIC/ELECTROSTRICTIVE FILM DEVICE

BACKGROUND OF THE INVENTION

1. Field of the Invention

The present invention relates to a piezoelectric/electrostrictive film device comprising a piezoelectric/electrostrictive layer and at least a pair of electrodes formed on the piezoelectric/electrostrictive layer, on a substrate having a thin-walled section and a thick-walled section formed around the thin-walled section. In particular, the present invention relates to a piezoelectric/electrostrictive film device for converting electric energy into mechanical energy to be used, for example, for an ink-jet head and a display, or a piezoelectric/electrostrictive film device for converting mechanical energy into electric energy.

2. Description of the Related Art

Piezoelectric/electrostrictive film device have been hitherto known as devices capable of controlling minute displacements in sub-microns. In particular, a piezoelectric/electrostrictive film device, which is constructed by stacking a piezoelectric/electrostrictive layer based on piezoelectric ceramics and an electrode layer for applying a voltage thereto, is preferably usable to control the minute displacement. Besides, such a piezoelectric/electrostrictive film device has features including, for example, high electromechanical conversion efficiency, high speed response performance, durability, and small electric power consumption. The piezoelectric/electrostrictive film device, which has the features as described above, is used, for example, as piezoelectric pressure sensors, probe movement mechanisms of scanning tunneling microscopes, straight guide mechanisms of ultra-high-precision machining machines, servo valves for hydraulic pressure control, heads of VTR machines, picture elements or images pixels for constructing flat panel type image display apparatuses, and heads for ink-jet printers.

When the piezoelectric/electrostrictive film device is used as an actuator, then a positive or negative voltage is applied to one electrode, and the other electrode is grounded. In this situation, the piezoelectric/electrostrictive effect is brought about in the piezoelectric/electrostrictive layer, and the mechanical displacement is generated in the stacking direction of the piezoelectric/electrostrictive layer.

It is assumed that the effective driving electric field, which is applied to the piezoelectric/electrostrictive layer, is increased in order to obtain a larger displacement amount. As for the range of the electric field, it has been tried to use a wide range ranging from the negative electric field to the positive electric field.

However, when the driving operation including the negative electric field is performed for a long period of time, the displacement amount is considerably lowered. For this reason, it is necessary to provide a special circuit for adjusting the driving electric field depending on the decrease in displacement amount, which is feared to be a factor to increase the cost. Further, it is feared that the reliability may be deteriorated and the service life or durability may be lowered for a variety of apparatuses which use the piezoelectric/electrostrictive film device as described above. Furthermore, the displacement amount is sometimes insufficient depending on the use of the piezoelectric/electrostrictive film device.

SUMMARY OF THE INVENTION

The present invention has been made taking the foregoing problems into consideration, an object of which is to provide a piezoelectric/electrostrictive film device in which the decrease in displacement amount is suppressed even when the driving operation is performed for a long period while setting the effective driving electric field to be within a wide range ranging from the negative electric field to the positive electric field, wherein it is unnecessary to provide any special circuit, and it is possible to improve the reliability and achieve a long period of service life.

According to the present invention, a piezoelectric/electrostrictive film device is provided, including a piezoelectric/electrostrictive layer, and at least a pair of electrodes formed on the piezoelectric/electrostrictive layer, on a substrate having a thin-walled section and a thick-walled section formed around the thin-walled section. A perovskite piezoelectric/electrostrictive material of the piezoelectric/electrostrictive layer contains Pb, and the perovskite piezoelectric/electrostrictive material contains $MnO_2$ in an amount of 0.1 to 0.5% by weight.

Accordingly, it is possible to suppress the decrease in displacement amount even when the driving operation is performed for a long period while setting the effective driving electric field to be within a wide range ranging from the negative electric field to the positive electric field.

In this arrangement, it is also preferable that the perovskite piezoelectric/electrostrictive material contains $Pb(Mg_{1/3} Nb_{2/3})O_3$—$PbZrO_3$—$PbTiO_3$ in which a part of Pb is substituted with Sr.

It is also preferable that the perovskite type piezoelectric/electrostrictive material has a non-stoichiometric composition.

When the piezoelectric/electrostrictive film device according to the present invention is driven, it is preferable that the piezoelectric/electrostrictive film device is driven to satisfy:

$$-0.8Ec \leq E1 \leq 0; \text{ and}$$

$$1000 \leq E2 \leq 4000;$$

wherein E1 (V/mm) and E2 (V/mm) represent a minimum electric field and a maximum electric field to be applied to the piezoelectric/electrostrictive layer respectively, and Ec (V/mm) represents a coercive electric field.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 8 shows a table illustrating results of exemplary experiments (measurement of the behavior of change relevant to the initial displacement amount obtained when the driving electric field is applied and the displacement amount obtained after the repeated driving operation).

DESCRIPTION OF THE PREFERRED EMBODIMENTS

Illustrative embodiments of the piezoelectric/electrostrictive film device according to the present invention will be explained below with reference to FIGS. 1 to 11.

Figure 1:
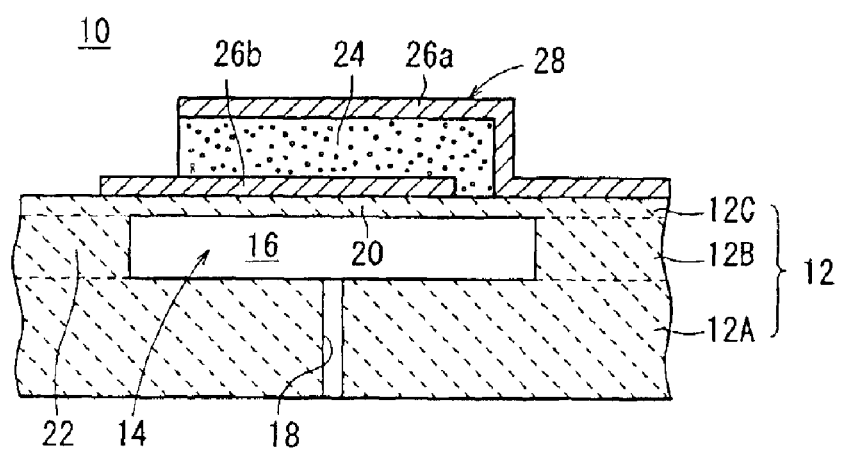
FIG. 1 is a sectional view illustrating a piezoelectric/electrostrictive film device according to an embodiment of the present invention.

As shown in FIG. 1, a piezoelectric/electrostrictive film device 10 according to an embodiment of the present invention comprises an actuator substrate 12 which is composed of, for example, ceramics, and an actuator element 14 which performs the displacement action in accordance with application of the voltage.

Hollow spaces 16 for forming respective vibrating sections as described later on are provided in the actuator substrate 12 at positions corresponding to the portions at which the respective actuator elements 14 are to be formed. The respective hollow spaces 16 communicate with the through-holes 18 each of which has a small diameter and which are provided at a lowermost layer of the actuator substrate 12.

The portion of the actuator substrate 12, at which the hollow space 16 is formed, is thin-walled. The other portion of the actuator substrate 12 is thick-walled. The thin-walled portion has a structure which tends to undergo vibration in response to the external stress, and it functions as a vibrating section 20. The portion other than the hollow space 16 is thick-walled, and it functions as a fixed section 22 for supporting the vibrating section 20.

That is, the actuator substrate 12 has a stacked structure comprising a substrate layer 12A as the lowermost layer, a spacer layer 12B as an intermediate layer, and a thin plate layer 12C as an uppermost layer. The actuator substrate 12 can be recognized to have an integrated structure including the hollow spaces 16 formed at the positions in the spacer layer 12B corresponding to the actuator elements 14. The substrate layer 12A functions as a substrate for reinforcement, as well as it functions as a substrate for wiring. The actuator substrate 12 may be formed as follows. That is, the respective layers may be simultaneously sintered and integrated into one unit. Alternatively, the respective layers may be laminated and integrated into one unit while successively sintering the respective layers. Further alternatively, the respective layers may be individually sintered, and then they may be laminated and integrated into one unit.

On the other hand, each of the actuator elements 14 comprises the vibrating section 20 and the fixed section 22, as well as a main actuator element 28 which is composed of a piezoelectric/electrostrictive layer 24 directly formed on the vibrating section 20, and a pair of electrodes (an upper electrode 26a and a lower electrode 26b) formed on an upper surface and a lower surface of the piezoelectric/electrostrictive layer 24.

The pair of electrodes may be embodied as follows, other then the upper electrode 26a and the lower electrode 26b described above. That is, as in a piezoelectric/electrostrictive film device 10a according to a first modified embodiment shown in FIG. 2, a pair of comb-shaped electrodes 26a, 26b as shown, for example, in FIG. 3 may be formed on the upper surface of the piezoelectric/electrostrictive layer 24. Alternatively, as in a piezoelectric/electrostrictive film device 10b according to a second modified embodiment shown in FIG. 4, a pair of electrodes 26a, 26b may be formed between the piezoelectric/electrostrictive layer 24 and the vibrating section 20.

Figure 5:
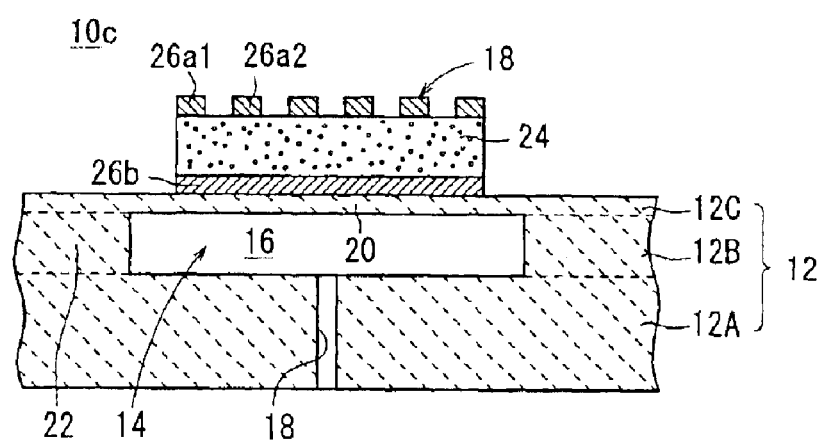
FIG. 5 is a sectional view illustrating a third modified embodiment of the piezoelectric/electrostrictive film device according to the embodiment of the present invention.

In another arrangement, as in a piezoelectric/electrostrictive film device 10c according to a third modified embodiment shown in FIG. 5, the upper electrode 26 may be formed with a plurality of strip-shaped electrodes 26a1, 26a2, and the lower electrode 26b may be formed to have a form of single flat film. Alternatively, as in a piezoelectric/electrostrictive film device 10d according to a fourth modified embodiment shown in FIG. 6, a pair of comb-shaped electrodes 26a, 26b may be embedded in the piezoelectric/electrostrictive layer 24. In this arrangement, the pair of electrodes 26a, 26b are formed that lower surfaces of the pair of electrodes 26a, 26b are contact the vibrating section 20.

Figure 6:
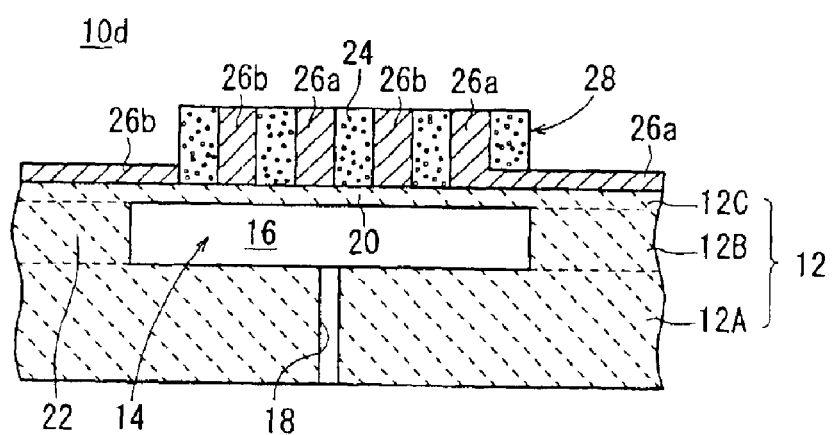
FIG. 6 is a sectional view illustrating a fourth modified embodiment of the piezoelectric/electrostrictive film device according to the embodiment of the present invention.

The structures shown in FIGS. 2 to 5 are advantageous in that the electric power consumption can be suppressed to be low. The structure shown in FIG. 6 is advantageous to generate large displacement, because this structure can effectively utilize the inverse piezoelectric effect in the electric field direction in which the strain and the generated force are large.

Next, explanation will be made for the respective constitutive members of the piezoelectric/electrostrictive film device 10 according to the embodiment of the present invention, especially for the selection of the material or the like for the respective constitutive members.

At first, it is preferable that the vibrating section 20 is composed of a highly heat-resistant material, for the following reason. That is, when the main actuator element 28 is stacked on the vibrating section 20 without using any material such as an organic adhesive which may deteriorate the characteristics, the heat treatment is performed in some cases when at least the piezoelectric/electrostrictive layer 24 is formed. The vibrating section 20 is preferably composed of a highly heat-resistant material in order that the vibrating section 20 is not deteriorated in quality during the process as described above.

It is preferable that the vibrating section 20 is composed of an electric insulating material in order to electrically separate the wiring connected to the upper electrode 26a formed on the actuator substrate 12, from the wiring connected to the lower electrode 26b.

Therefore, the vibrating section 20 may be composed of a highly heat-resistant metal or a porcelain enamel produced by coating the metal with a ceramic material such as glass. However, the vibrating section 20 is optimally composed of ceramics.

The vibrating section 20 may be composed of ceramics such as stabilized zirconium oxide, aluminum oxide, magnesium oxide, titanium oxide, spinel, mullite, aluminum nitride, silicon nitride, glass, or mixtures thereof. Stabilized zirconium oxide is especially preferred because of, for example, high mechanical strength obtained even if the thickness of the vibrating section 20 is thin, high toughness, and small chemical reactivity with the piezoelectric/electrostrictive layer 24 and the pair of electrodes 26a, 26b. The term "stabilized zirconium oxide" includes fully stabilized zirconium oxide and partially stabilized zirconium oxide. Stabilized zirconium oxide has a crystal structure such as cubic crystal, and hence it does not cause phase transition.

On the other hand, zirconium oxide causes phase transition between monoclinic crystal and tetragonal crystal at about 1000° C. Cracks appear during the phase transition in some cases. Stabilized zirconium oxide contains 1 to 30 mole % of a stabilizer such as calcium oxide, magnesium oxide, yttrium oxide, scandium oxide, ytterbium oxide, cerium oxide, and oxides of rare earth metals. In order to enhance the mechanical strength of the vibrating section 20, the stabilizer preferably contains yttrium oxide. In this composition, yttrium oxide is contained preferably in an amount of 1.5 to 6 mole %, and more preferably 2 to 4 mole %. It is much more preferable that aluminum oxide is further contained in an amount of 0.1 to 5 mole %.

The crystal phase may be, for example, a mixed phase of cubic crystal and monoclinic crystal, a mixed phase of tetragonal crystal and monoclinic crystal, and a mixed phase of cubic crystal, tetragonal crystal and monoclinic crystal. However, among them, most preferred are those having a principal crystal phase composed of tetragonal crystal or a mixed phase of tetragonal crystal and cubic crystal, from viewpoints of strength, toughness, and durability.

When the vibrating section 20 is composed of ceramics, a large number of crystal grains construct the vibrating section 20. In order to increase the mechanical strength of the vibrating section 20, the crystal grains preferably have an average grain diameter of 0.05 to 2 $\mu$m, and more preferably 0.1 to 1 $\mu$m.

The fixed section 22 is preferably composed of ceramics. The fixed section 22 may be composed of the same ceramic material as that used for the vibrating section 20, or the fixed section 22 may be composed of a ceramic material different from that used for the vibrating section 20. The fixed section 22 may be composed of ceramics such as stabilized zirconium oxide, aluminum oxide, magnesium oxide, titanium oxide, spinel, mullite, aluminum nitride, silicon nitride, glass, and mixtures thereof, in the same manner as the material for the vibrating section 20.

Especially, those preferably adopted for the actuator substrate 12 used in the ceramic device include, for example, materials containing a major component of zirconium oxide, materials containing a major component of aluminum oxide, and materials containing a major component of a mixture thereof. The usable materials containing a major component of zirconium oxide are more preferable particularly.

Clay or the like is added as a sintering aid in some cases. However, it is necessary to control components of the sintering aid in order not to contain an excessive amount of materials which are liable to form glass such as silicon oxide and boron oxide for the following reason. That is, although the materials are advantageous to join the actuator substrate 12 to the piezoelectric/electrostrictive layer 24, the materials facilitate the reaction between the actuator substrate 12 and the piezoelectric/electrostrictive layer 24, making it difficult to maintain a predetermined composition of the piezoelectric/electrostrictive layer 24. As a result, the device characteristics may deteriorate.

That is, it is preferable that silicon oxide or the like in the actuator substrate 12 is restricted to have a weight ratio of not more than 3%, and more preferably not more than 1%. The term "major component" herein refers to the component which exists in a proportion of not less than 50% in weight ratio.

Figure 2:
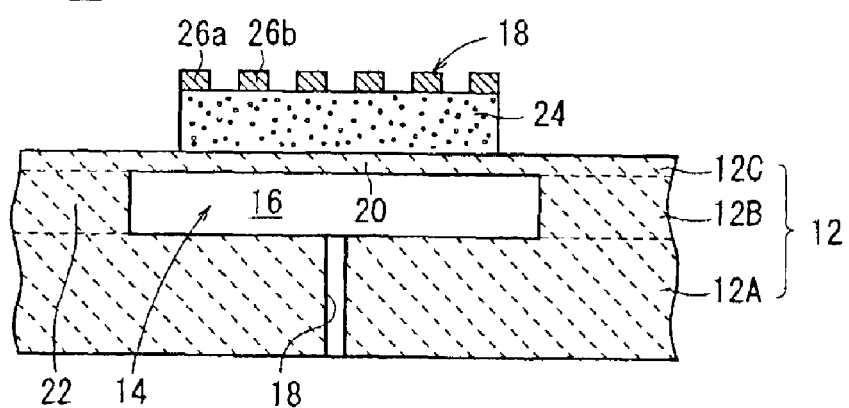
FIG. 2 is a sectional view illustrating a first modified embodiment of the piezoelectric/electrostrictive film device according to the embodiment of the present invention.
Figure 3:
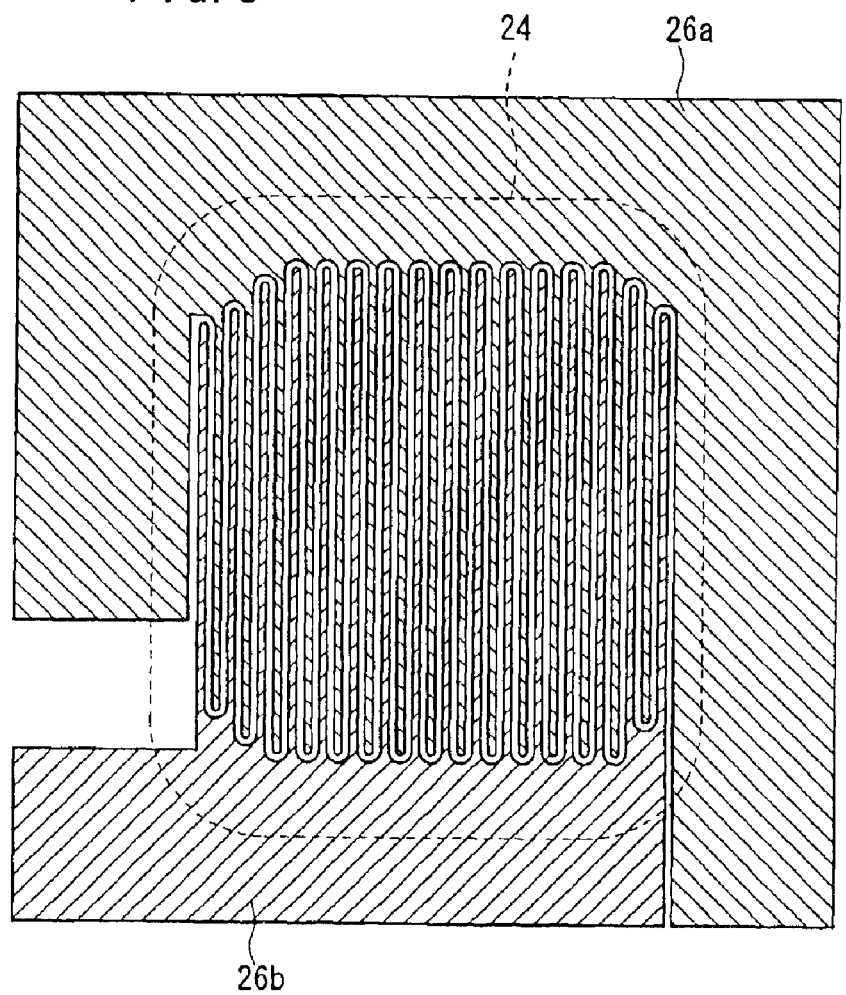
FIG. 3 is a plan view illustrating an electrode structure of the piezoelectric/electrostrictive film device according to the first modified embodiment.
Figure 4:
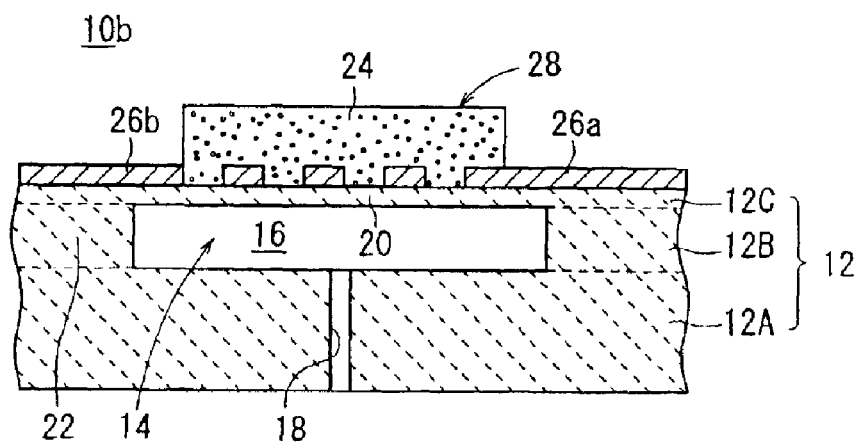
FIG. 4 is a sectional view illustrating a second modified embodiment of the piezoelectric/electrostrictive film device according to the embodiment of the present invention.

The upper electrode 26a and the lower electrode 26b formed on the upper surface and the lower surface of the piezoelectric/electrostrictive layer 24, the pair of electrodes 26a, 26b formed on the upper surface of the piezoelectric/electrostrictive layer 24 as shown in FIG. 2, the pair of electrodes 26a, 26b formed between the piezoelectric/electrostrictive layer 24 and the vibrating section 20 as shown in FIG. 4, the upper electrode 26a and the lower electrode 26b in which the upper electrode 26a is formed with the plurality of strip-shaped electrodes 26a1, 26a2 and the lower electrode 26b is formed to have the form of single flat film as shown in FIG. 5, and the pair of electrodes 26a, 26b formed by being embedded in the piezoelectric/electrostrictive layer 24 as shown in FIG. 6 are allowed to have an appropriate thickness depending on the application. However, the thickness is preferably 0.01 to 50 $\mu$m, and more preferably 0.1 to 5 $\mu$m.

Each of the lower electrode 26b shown in FIG. 1, the pair of electrodes 26a, 26b shown in FIG. 4, the lower electrode 26b shown in FIG. 5, and the pair of electrodes 26a, 26b shown in FIG. 6 is composed of the electrode material which contains a simple substance of an element belonging to the platinum group, an alloy of the simple substance of the element belonging to the platinum group and gold and/or silver, an alloy of an element belonging to the platinum group, or an alloy of the alloy of the element belonging to the platinum group and gold and/or silver. Preferably, the electrode material is a material containing a major component of platinum.

The upper electrode 26a is preferably composed of a conductive metal which is solid at room temperature. The metal includes, for example, metal simple substances or alloys containing, for example, aluminum, titanium, chromium, iron, cobalt, nickel, copper, zinc, niobium, molybdenum, ruthenium, rhodium, silver, stannum, tantalum, tungsten, iridium, platinum, gold, and lead. These elements may be contained in an arbitrary combination.

A variety of known film formation methods may be used to form the lower electrode 26b and the upper electrode 26a. Specifically, a selection is appropriately made for thin film formation methods such as ion beam, sputtering, vacuum evaporation, CVD, the ion plating, and plating, and thick film formation methods such as screen printing, the spray, and dipping. The sputtering method and the screen printing methods are especially preferably selected. The heat treatment is performed, if necessary.

Figure 7A:
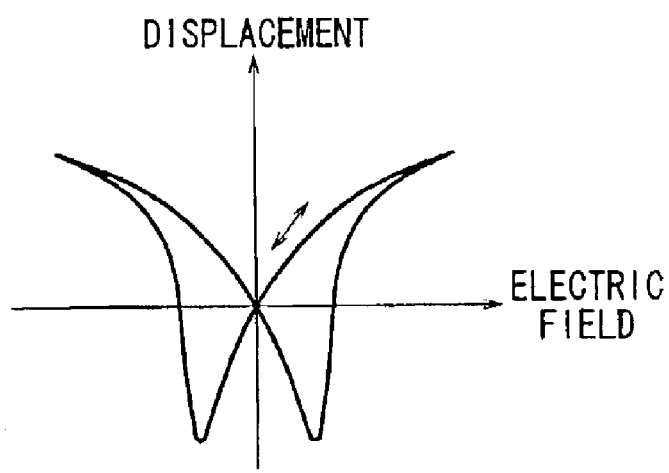
FIG. 7A shows a hysteresis characteristic of an actuator element.

In the case of the ordinary piezoelectric/electrostrictive film device, the displacement pattern of the actuator element 14, which is obtained when the electric field is applied to the piezoelectric/electrostrictive layer 24, has the hysteresis characteristic as shown in FIG. 7A. This indicates the fact that the displacement appears equivalently in the piezoelectric/electrostrictive layer 24 of the actuator element 14 even when the polarity of the electric field differs, provided that the absolute value of the magnitude of the electric field is identical.

Figure 7B:
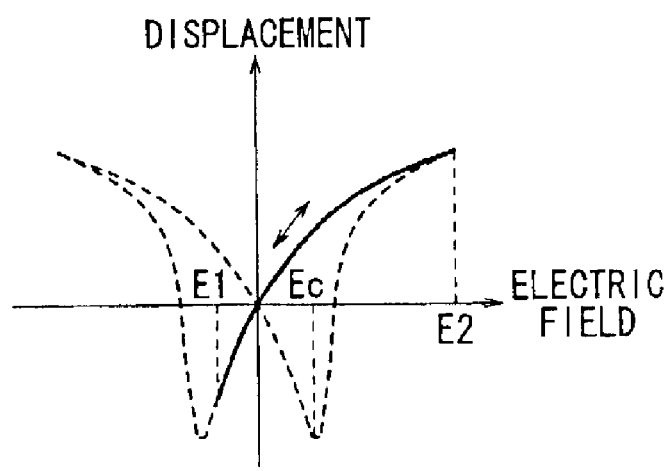
FIG. 7B shows a displacement characteristic obtained when the driving operation is performed by using a wide range ranging from the negative electric field to the positive electric field.

It is conceived that the effective driving electric field, which is applied to the piezoelectric/electrostrictive layer 24, is increased in order to obtain a larger displacement amount in the actuator element 14. For example, as shown in FIG. 7B, it is assumed that the driving operation is performed to satisfy:

$-0.8Ec \leq E1 \leq 0$; and $1000 \leq E2 \leq 4000$;

provided that E1 (V/mm) and E2 (V/mm) represent the minimum electric field and the maximum electric field to be applied to the piezoelectric/electrostrictive layer 24 respectively, and Ec (V/mm) represents the coercive electric field.

Figure 7C:
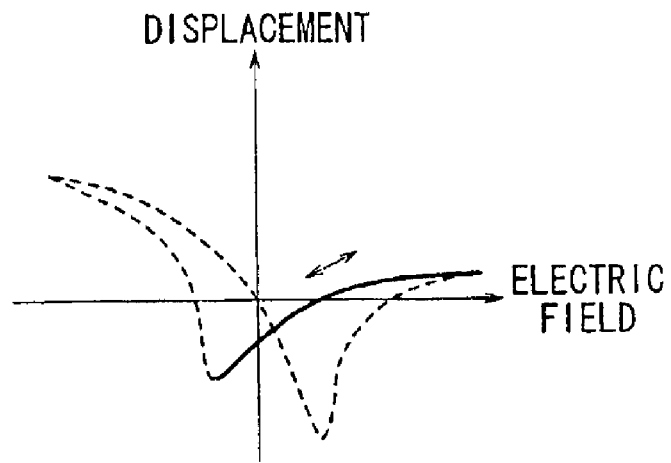
FIG. 7C shows a displacement characteristic obtained in a state in which the displacement amount is lowered.

However, if the driving operation is repeatedly performed for a long period of time, then the displacement pattern of the actuator element 14 with respect to the electric field is changed as shown in FIG. 7C, and the decrease in displacement amount of the actuator element 14 appears.

In view of the above, the piezoelectric/electrostrictive film device 10 according to the embodiment of the present invention is constructed so that the decrease in displacement amount is effectively suppressed, even when the driving operation is performed for a long period with a wide range of the effective driving electric field ranging from the negative electric field to the positive electric field.

That is, the piezoelectric/electrostrictive film device 10 according to the embodiment of the present invention has the piezoelectric/electrostrictive layer 24 of the perovskite piezoelectric/electrostrictive material which contains Pb and which contains $MnO_2$ in an amount of 0.1 to 0.5% by weight.

Specifically, the perovskite piezoelectric/electrostrictive material of the piezoelectric/electrostrictive layer 24 contains $Pb(Mg_{1/3}Nb_{2/3})O_3$—$PbZrO_3$—$PbTiO_3$ in which a part of Pb is substituted with Sr.

To prepare the piezoelectric/electrostrictive material as described above, the oxide-mixing method is useful, for example. For example, the piezoelectric/electrostrictive material can be prepared by means of a method in which raw powder materials of, for example, PbO, $SrCO_3$, $MgCO_3$, $Nb_2O_5$, $ZrO_2$, $TiO_2$, and $MnO_2$ are weighed to give a predetermined composition, followed by performing mixing, preliminary sintering, and pulverization. The other methods to prepare the piezoelectric/electrostrictive material include, for example, the coprecipitation method and the alkoxide method.

The method for forming the piezoelectric/electrostrictive layer 24 on the vibrating section 20 may be various types of the thick film formation method such as screen printing, dipping the application method, and the electrophoresis and various types of the thin film formation methods such as the ion beam method, the sputtering, vacuum evaporation, the ion plating, chemical vapor deposition (CVD), and plating.

In this embodiment, when the piezoelectric/electrostrictive layer 24 is formed on the vibrating section 20, the thick film formation method is preferably adopted, which is based on, for example, screen printing, dipping, the application method, and electrophoresis method, for the following reason.

That is, in the techniques described above, the piezoelectric/electrostrictive layer 24 can be formed by using, for example, paste, slurry, suspension, emulsion, or sol containing a major component of piezoelectric ceramic particles having an average grain size of 0.01 to 5 μm, preferably 0.05 to 3 μm, in which it is possible to obtain good piezoelectric operation characteristics.

Especially, the electrophoresis method makes it possible to form the film having a high density and a high shape accuracy, and the electrophoresis method further has the features as described in technical literatures such as "Preparation of Electronic Materials by Electrophoretic Deposition" written by Kazuo ANZAI, DENKI KAGAKU 53, No. 1 (1985), pp. 63–68 and "Proceedings of First Symposium on Higher-Order Ceramic Formation Method Based on Electrophoresis" 1998, pp. 5–6 and pp. 23–24. Therefore, the technique may be appropriately selected and used considering, for example, the required accuracy and the reliability.

It is preferable that the thickness of the vibrating section 20 has a dimension identical to that of the thickness of the piezoelectric/electrostrictive layer 24, for the following reason. That is, if the thickness of the vibrating section 20 is extremely thicker than the thickness of the piezoelectric/electrostrictive layer 24 (if the former is different from the latter by not less than one figure), when the piezoelectric/electrostrictive layer 24 makes shrinkage upon the sintering, then the vibrating section 20 behaves to inhibit the shrinkage. For this reason, the stress at the boundary surface between the piezoelectric/electrostrictive layer 24 and the actuator substrate 12 is increased, and consequently they are easily peeled off from each other. On the contrary, when the dimension of the thickness is in an identical degree between the both, it is easy for the actuator substrate 12 (vibrating section 20) to follow the shrinkage of the piezoelectric/electrostrictive layer 24 upon the sintering. Accordingly, such dimension of the thickness is preferred to achieve the integration. Specifically, the vibrating section 20 preferably has a thickness of 1 to 100 μm, more preferably 3 to 50 μm, and much more preferably 5 to 20 μm. On the other hand, the piezoelectric/electrostrictive layer 24 preferably has a thickness of 5 to 100 μm, more preferably 5 to 50 μm, and much more preferably 5 to 30 μm.

The piezoelectric/electrostrictive layer 24 formed as described above is heat-treated, if necessary, and the piezoelectric/electrostrictive layer 24 is integrated with the lower electrode 26b formed on the actuator substrate 12.

Certain exemplary experiments will now be described. In Comparative Examples 1 to 7 and Examples 1 to 21, the driving electric field was applied respectively to measure the initial displacement amount obtained thereby and the behavior of change of the displacement amount after the repeated driving operation. The period of time, in which the repeated driving operation was performed, was 50 hours, 150 hours, and 500 hours. Results of the measurement are shown in FIG. 8.

In FIG. 8, the numerals in the column of the change of displacement amount are transcribed as relative values assuming that the initial displacement amount obtained in Comparative Example 1 corresponds to 100. The numerals in the parentheses indicate the rate (%) of decrease in displacement amount with respect to the initial displacement amount.

The driving condition was as follows. That is, the piezoelectric/electrostrictive layer had a size of about 20 μm, for which the waveform of the driving voltage was pulse-shaped. The minimum applied voltage was −10 V, and the maximum applied voltage was 55 V. The duty ratio (time of application of −10 V/time of application of 55 V) of the voltage waveform was 1/9, the frequency was 60 Hz, and the environmental temperature was 45° C. The displacement amount of each of the piezoelectric/electrostrictive film devices was measured by measuring the displacement amount obtained when 60 V was applied at room temperature.

A/B in the column of the composition in each of Comparative Examples and Examples indicates the mole ratio assuming that A represents Pb and Sr and B represents Mg, Nb, Zr, and Ti in $(Pb, Sr)(Mg_{1/3}Nb_{2/3}, Zr, Ti)O_3$. In the case of the stoichiometric composition, A/B=1 is given. The amount of substitution with Sr in the column of the composition is written by mol % with respect to Pb.

The amount of substitution with Sr was zero in all cases of Comparative Examples 1 to 3 and Examples 1 to 5. Especially, Comparative Example 1 is illustrative of a case in which $MnO_2$ was not added to the constitutive materials for the piezoelectric/electrostrictive layer 24. Comparative Example 2 is illustrative of a case in which $MnO_2$ was added in an amount of 0.05% by weight to the constitutive materials for the piezoelectric/electrostrictive layer 24. Comparative Example 3 is illustrative of a case in which $MnO_2$ was added in an amount of 1.0% by weight to the constitutive materials for the piezoelectric/electrostrictive layer 24.

Examples 1 to 5 are illustrative of cases in which $MnO_2$ was added to the constitutive materials for the piezoelectric/electrostrictive layer 24 in amounts of 0.1% by weight, 0.2% by weight, 0.3% by weight, 0.4% by weight, and 0.5% by weight respectively.

All of Comparative Examples 4 to 6 and Examples 6 to 10 indicate cases in which the amount of substitution with Sr was 10. The amount of addition of $MnO_2$ was equivalent to those of Comparative Examples 1 to 3 and Examples 1 to 5 described above.

The amount of addition of $MnO_2$ was 0.2% by weight in all cases of Comparative Example 7 and Examples 11 to 13. Comparative Example 7 is illustrative of a case in which the amount of substitution with Sr was 20, and Examples 11 to 13 are illustrative of cases in which the amount of substitution with Sr was 2, 5, and 15 respectively.

Examples 14 to 19 are illustrative of cases in which the amount of addition of $MnO_2$ was 0.2% by weight, and the amount of substitution with Sr was 10, wherein A/B was gradually increased.

Examples 20 and 21 are illustrative of cases in which the amount of addition of $MnO_2$ was 0.2% by weight, and the amount of substitution with Sr was zero, wherein A/B was 0.96 and 1.02 respectively.

According to the results shown in FIG. 8, the following fact is appreciated. That is, when the stoichiometric composition is used for the perovskite type piezoelectric/electrostrictive material, if the amount of addition of $MnO_2$ is within the range of 0.1 to 0.5% by weight provided that the amount of substitution with Sr is within the range of 0 to 15, then the displacement amount exceeding 100 can be obtained at the initial stage and after the repeated driving operation, and the rate of decrease in displacement amount is the small value, i.e., 13.7 at the maximum.

When the amount of substitution with Sr is 10, then the initial displacement amount is large, and the decrease in displacement amount can be suppressed, as compared with the case in which the amount of substitution with Sr is zero.

As also appreciated from the results of Examples 14 to 21, when the non-stoichiometric composition is used for the perovskite type piezoelectric/electrostrictive material, the initial displacement amount is further increased, and it is possible to further suppress the decrease in displacement amount.

As described above, in the piezoelectric/electrostrictive film device 10 according to the embodiment of the present invention, a perovskite piezoelectric/electrostrictive material of the piezoelectric/electrostrictive layer (24) contains Pb, and the perovskite piezoelectric/electrostrictive material contains $MnO_2$ in an amount of 0.1 to 0.5% by weight. Therefore, even when the effective driving electric field is allowed to be within the wide range ranging from the negative electric field to the positive electric field as shown in FIG. 7B to perform the driving operation for a long period, then the decrease in displacement amount as shown in FIG. 7C is suppressed, and the displacement characteristic shown in FIG. 7B can be maintained approximately as it is. Therefore, it is successfully unnecessary to provide any special circuit for adjusting the driving electric field depending on the decrease in displacement amount. Further, it is possible to improve the reliability and achieve the long service life or durability.

Figure 9:
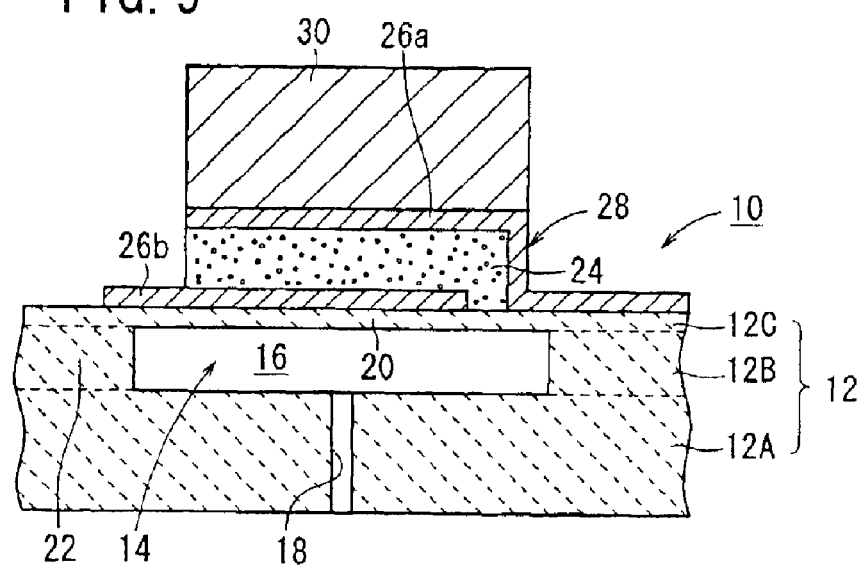
FIG. 9 shows an arrangement illustrating a state in which a displacement-transmitting member is placed or formed on the actuator element of the piezoelectric/electrostrictive film device according to the embodiment of the present invention.

According to the fact as described above, the piezoelectric/electrostrictive film device 10 according to the embodiment of the present invention may be used, for example, in a form as shown in FIG. 9. That is, a displacement-transmitting member 30, which is provided to transmit the displacement of the actuator element 14, for example, in the upward direction, is placed or formed on the upper portion of the actuator element 14. Accordingly, application may be made to a variety of fields. That is, various ones are usable for the displacement-transmitting member 30 depending on the embodiments of the piezoelectric/electrostrictive film device 10 according to the embodiment of the present invention.

Figure 10:
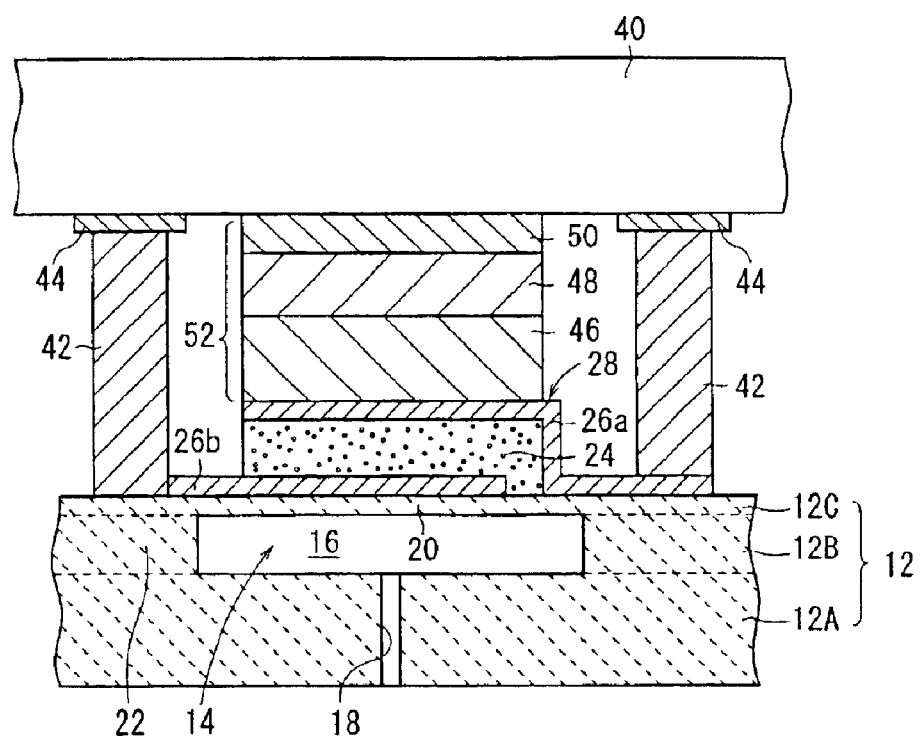
FIG. 10 shows an arrangement illustrating, with partial omission, an example in which the piezoelectric/electrostrictive film device according to the embodiment of the present invention is applied to a display.

For example, when the piezoelectric/electrostrictive film device 10 is used for the picture elements (image pixels) of a display, the following structure may be adopted as shown in FIG. 10. That is, an optical waveguide plate 40 is arranged opposingly to the actuator substrate 12. Further, a plurality of crosspieces 42 are formed between the optical waveguide plate 40 and the actuator substrate 12. The actuator elements 14 are arranged corresponding to the respective picture elements. FIG. 10 is illustrative of a case in which light-shielding layers 44 are formed between the optical waveguide plate 40 and the crosspieces 42 respectively.

A picture element assembly 52, which is composed of a stack based on resin including, for example, a white scattering element 46, a color layer 48, and a transparent layer 50, is formed on each of the actuator elements 14. The picture element assembly 52 makes contact and separation with respect to the optical waveguide plate 40 in accordance with the displacement action of the actuator element 14.

Light is introduced from an unillustrated light source into the optical waveguide plate 40. When the end surface of the picture element assembly 52 makes contact with the optical waveguide plate 40 in accordance with the displacement action of the actuator element 14, light is emitted from a position corresponding to the picture element assembly 52 of the front surface (display surface) of the optical waveguide plate 40. In other words, an image is displayed on the display surface by controlling the presence or absence of light emission (leakage light) at the display surface in accordance with the presence or absence of the contact of the picture element assembly 52 with the optical waveguide plate 40.

For example, in the structure as shown in FIGS. 9 and 10, the thickness of the thin plate layer 12C is usually not more than 50 $\mu$m and preferably about 3 to 20 $\mu$m in order to greatly displace the actuator element 14.

Figure 11:
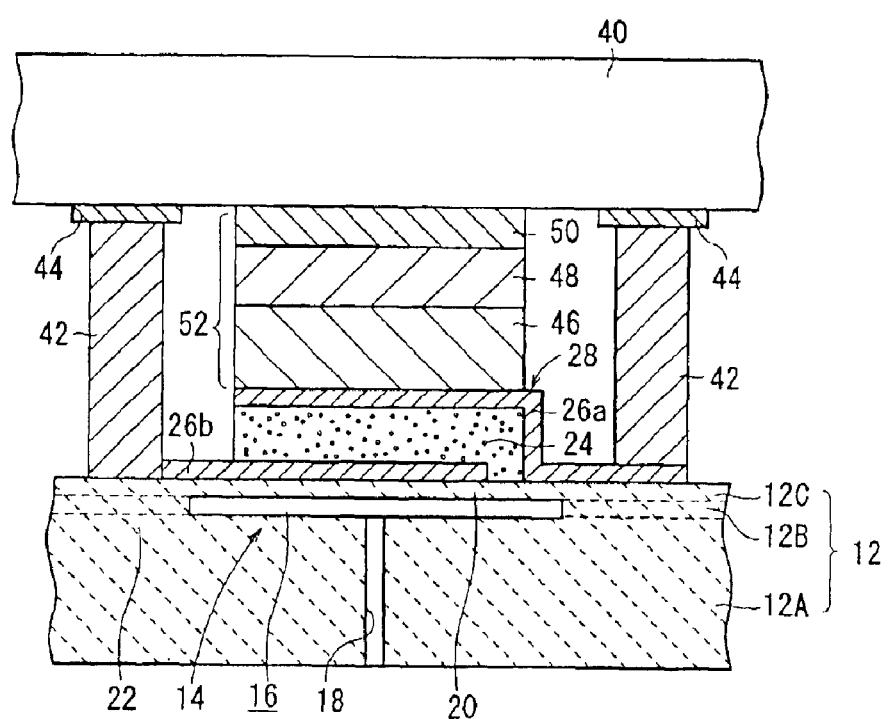
FIG. 11 shows an arrangement illustrating, with partial omission, another example in which the piezoelectric/electrostrictive film device according to the embodiment of the present invention is applied to a display.

It is enough that the spacer layer 12B exists to constitute the hollow space 16 in the actuator substrate 12, and its thickness is not specifically limited. However, on the other hand, the thickness may be determined depending on the purpose of use of the hollow space 16. Especially, the thickness is not more than a thickness which is necessary for the actuator element 14 to function. For example, as shown in FIG. 11, it is preferable that the spacer layer 12B is constructed in a thin state. That is, it is preferable that the thickness of the spacer layer 12B is equivalent to the magnitude of the displacement of the actuator element 14 to be used.

Owing to the arrangement as described above, the following effect is obtained. That is, the flexion of the thin-walled portion (portion of the vibrating section 20) is restricted by the substrate layer 12A which is disposed closely in the direction of flexion. It is possible to prevent the thin-walled portion from destruction which would be otherwise caused by unintentional application of any external force. It is also possible to stabilize the displacement of the actuator element 14 to have a specified value by utilizing the effect to restrict the flexion brought about by the substrate layer 12A.

When the spacer layer 12B is made thin, then the thickness of the actuator substrate 12 itself is decreased, and it is possible to decrease the flexural rigidity. Accordingly, for example, when the actuator substrate 12 is bonded and fixed to another member, then the warpage or the like of the subject (in this case, the actuator substrate 12) is effectively reformed with respect to the object (for example, the optical waveguide plate 40), and it is possible to improve the reliability of the bonding and the fixation.

Additionally, the actuator substrate 12 is constructed to be thin as a whole, and hence it is possible to reduce the amount of use of raw materials when the actuator substrate 12 is produced. This structure is also advantageous in view of the production cost. Therefore, in particular, it is preferable that the thickness of the spacer layer 12B is 3 to 50 $\mu$m. Especially, it is preferable that the thickness of the spacer layer 12B is 3 to 20 $\mu$m.

On the other hand, the thickness of the substrate layer 12A is generally not less than 50 $\mu$m and preferably about 80 to 300 $\mu$m in order to reinforce the entire actuator substrate 12, because the spacer layer 12B is constructed to be thin as described above.

In the embodiment described above, the perovskite type piezoelectric/electrostrictive material contains $Pb(Mg_{1/3}Nb_{2/3})O_3$—$PbZrO_3$—$PbTiO_3$ as the piezoelectric/electrostrictive material. Alternatively, it is also allowable to use a perovskite type piezoelectric/electrostrictive material based on $PbZrO_3$—$PbTiO_3$ generally referred to as "PZT system". Further alternatively, it is also allowable to use a composite perovskite type piezoelectric/electrostrictive material such as $Pb(Ni_{1/3}Nb_{2/3})O_3$, $Pb(Zn_{1/3}Nb_{2/3})O_3$, $Pb(Yb_{1/2})O_3$, and $Pb(Sc_{1/2}Ta_{1/2})O_3$, in place of $Pb(Mg_{1/3}Nb_{2/3})O_3$ described above. Further, the perovskite type piezoelectric/electrostrictive material containing Pb may be substituted and/or added, for example, with La and/or Ni in order to improve, for example, the characteristics and the sintering performance.

It is a matter of course that the piezoelectric/electrostrictive film device according to the present invention is not limited to the embodiments described above, which may be embodied in other various forms without deviating from the gist or essential characteristics of the present invention.

What is claimed is:

1. A piezoelectric/electrostrictive film device comprising:
   a substrate having a thin-walled section and a thick-walled section formed around said thin-walled section;
   a piezoelectric/electrostrictive layer supported by said substrate and comprising a perovskite piezoelectric/electrostrictive material containing Pb and 0.1 to 0.5 wt % $MnO_2$ ;
   at least a pair of electrodes formed on said piezoelectric/electrostrictive layer; and
   means for applying a driving electric field to said piezoelectric/electrostrictive layer such that said piezoelectric/electrostrictive device is driven to satisfy:

$-0.8Ec \leq E1 \leq 0$; and $1000 \leq E2 \leq 4000$;

wherein E1 (V/mm) and E2 (V/mm) represent a minimum driving electric field and a maximum driving electric field applied to said piezoelectric/electrostrictive layer, respectively, and Ec (V/mm) represents a coercive electric field.

2. A piezoelectric/electrostrictive film device comprising:
   a substrate having a thin-walled section and a thick-walled section formed around said thin-walled section;
   a piezoelectric/electrostrictive layer supported by said substrate and comprising a perovskite piezoelectric/electrostrictive material containing $Pb(Mg_{1/3}Nb_{2/3})O_3$—$PbZrO_3$—$PbTiO_3$ in which a part of Pb is substituted with Sr, and containing $MnO_2$ in an amount of 0.1 to 0.5 wt %;
   at least a pair of electrodes formed on said piezoelectric/electrostrictive layer; and
   means for applying a driving electric field to said piezoelectric/electrostrictive layer such that said piezoelectric/electrostrictive device is driven to satisfy:

$-0.8Ec \leq E1 \leq 0$; and $1000 \leq E2 \leq 4000$;

wherein E1 (V/mm) and E2 (V/mm) represent a minimum driving electric field and a maximum driving electric field applied to said piezoelectric/electrostrictive layer, respectively, and Ec (V/mm) represents a coercive electric field.

3. A piezoelectric/electrostrictive film device comprising:
   a substrate having a thin-walled section and a thick-walled section formed around said thin-walled section;
   a piezoelectric/electrostrictive layer supported by said substrate and comprising a perovskite piezoelectric/electrostrictive material having a non-stoichiometric composition containing Pb and 0.1 to 0.5 wt% $MnO_2$;
   at least a pair of electrodes formed on said piezoelectric/electrostrictive layer; and
   means for applying a driving electric field to said piezoelectric/electrostrictive layer such that said piezoelectric/electrostrictive device is driven to satisfy:

$-0.8Ec \leq E1 \leq 0$; and $1000 \leq E2 \leq 4000$;

wherein E1 (V/mm) and E2 (V/mm) represent a minimum driving electric field and a maximum driving electric field applied to said piezoelectric/electrostrictive layer, respectively, and Ec (V/mm) represents a coercive electric field.

* * * * *